United States Patent
Lee et al.

(10) Patent No.: US 7,304,548 B2
(45) Date of Patent: Dec. 4, 2007

(54) DIFFERENTIAL VOLTAGE CONTROLLED OSCILLATOR USING COMPLEMENTARY TRANSISTORS CROSS-COUPLED IN SERIES, AND TRANSCEIVER USING THE SAME

(75) Inventors: Sang Gug Lee, Daejeon (KR); So Bong Shin, Daejeon (KR); Seok Ju Yun, Daegu (KR)

(73) Assignee: Information and Communications University Research and Industrial Cooperation Group, Daejeon (KR)

( * ) Notice: Subject to any disclaimer, the term of this patent is extended or adjusted under 35 U.S.C. 154(b) by 0 days.

(21) Appl. No.: 11/142,434

(22) Filed: Jun. 1, 2005

(65) Prior Publication Data

US 2005/0264371 A1   Dec. 1, 2005

(30) Foreign Application Priority Data

Jun. 1, 2004   (KR) ...................... 10-2004-0039620

(51) Int. Cl.
*H03B 5/12*   (2006.01)
(52) U.S. Cl. ........................... 331/117 FE; 331/117 R; 331/177 V
(58) Field of Classification Search .......... 331/117 FE, 331/117 R, 177 V
See application file for complete search history.

(56) References Cited

U.S. PATENT DOCUMENTS

| | | | | |
|---|---|---|---|---|
| 6,509,805 B2* | 1/2003 | Ochiai | ................... | 331/117 FE |
| 6,650,195 B1* | 11/2003 | Brunn et al. | ............ | 331/177 V |
| 6,690,244 B2* | 2/2004 | Mernyei et al. | ........ | 331/117 R |
| 6,970,048 B1* | 11/2005 | Devnath et al. | ............... | 331/46 |
| 7,015,768 B1* | 3/2006 | Talwalkar | ................ | 331/177 V |
| 7,034,626 B2* | 4/2006 | Akeyama et al. | ...... | 331/117 FE |
| 7,057,469 B2* | 6/2006 | Prentice | ................... | 331/117 R |

\* cited by examiner

*Primary Examiner*—Robert Pascal
*Assistant Examiner*—Levi Gannon
(74) *Attorney, Agent, or Firm*—Alston & Bird LLP

(57) ABSTRACT

A differential voltage controlled oscillator comprises first and second transistors having opposite magnitudes and directions of currents flowing to a third electrode from a second electrode corresponding to a voltage between first and second electrodes; and a resonance circuit coupled to the second electrodes of the first and second transistors and controlling a frequency of an oscillation signal corresponding to a control voltage. The second electrode of the first transistor is coupled to the first electrode of the second transistor to form a first output terminal, the first electrode of the first transistor is coupled to the second electrode of the second transistor to form a second output terminal, and the third electrodes of the first and second transistors are coupled to first and second powers.

10 Claims, 6 Drawing Sheets

DIFFERENTIAL VOLTAGE CONTROLLED OSCILLATOR USING COMPLEMENTARY TRANSISTORS CROSS-COUPLED IN SERIES, AND TRANSCEIVER USING THE SAME

CROSS REFERENCE TO RELATED APPLICATION

This application claims priority to and the benefit of Korea Patent Application No. 10-2004-39620 filed on Jun. 1, 2004 in the Korean Intellectual Property Office, the entire content of which is incorporated herein by reference.

BACKGROUND OF THE INVENTION (a) Field of the Invention

The present invention relates to a differential voltage controlled oscillator. More specifically, the present invention relates to a differential voltage controlled oscillator using cross-coupled complementary transistors, and a transceiver using the same.

(b) Description of the Related Art

Figure 1:
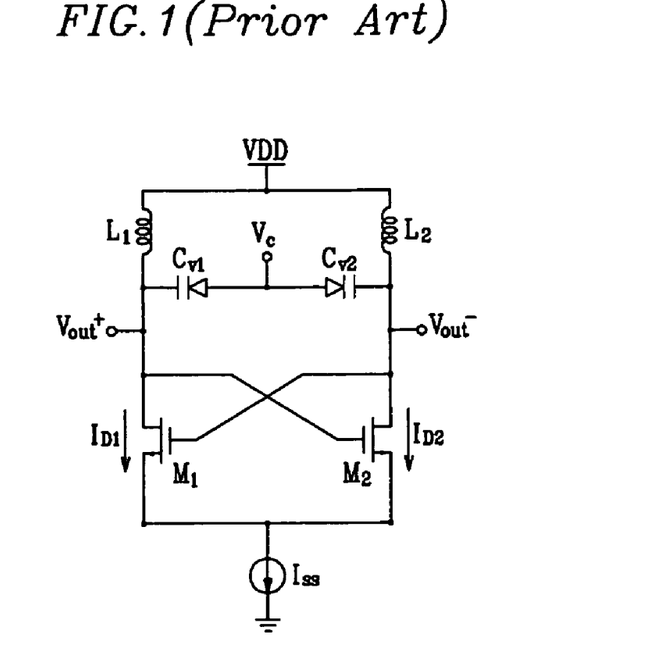
FIG. 1 shows a conventional differential voltage controlled oscillator (VCO)

FIG. 1 shows a conventional differential voltage controlled oscillator (VCO) including NMOS transistors M1 and M2, varactors Cv1 and Cv2, inductors L1 and L2, and a current source $I_{SS}$.

The NMOS transistors M1 and M2 are cross-coupled, the inductors L1 and L2 and the varactors Cv1 and Cv2 form a resonance circuit, one electrode of each of the varactors Cv1 and Cv2 are coupled to each other, and a control voltage of Vc is applied to a node of each electrode thereof.

The differential conventional VCO cross-couples the NMOS transistors M1 and M2 to generate negative resistance, and uses the control voltage of Vc to control the capacitance of the varactors Cv1 and Cv2, thereby controlling the frequency of output signals.

However, it is required for the current source $I_{ss}$ to supply a current, corresponding to the sum of drain currents ID1 and ID2 needed for operating the NMOS transistors M1 and M2, so as to respectively supply the current to the NMOS transistors M1 and M2. Therefore, the current used by the VCO is increased and the power consumption is increased.

In addition, low-frequency noise generated by the NMOS transistors M1 and M2 and an active element (not illustrated) of the current source $I_{ss}$ is transitioned to an oscillation frequency of the resonance circuit, and a phase noise response of the output signals Vout+ and Vout− is accordingly degraded.

Further, the common source node of NMOS transistors provides mechanism for the flicker noise of transistor to be transferred to the oscillation frequency.

SUMMARY OF THE INVENTION

It is a first advantage of the present invention to reduce power consumption of a differential voltage controlled oscillator.

It is a second advantage of the present invention to reduce an area of an integrated circuit into which the differential voltage controlled oscillator is realized.

It is a third advantage of the present invention to provide differential outputs with a single circuit structure.

It is a fourth advantage of the present invention to provide a differential voltage controlled oscillator with an improved phase noise response.

In one aspect of the present invention, a differential voltage controlled oscillator comprises: a first complementary transistor and a second complementary transistor having opposite magnitudes and directions of currents flowing to a third electrode from a second electrode in correspondence to a voltage applied between a first electrode and the second electrode; and a resonance circuit being coupled to the second electrodes of the first and second transistors and controlling a frequency of an oscillation signal corresponding to a control voltage, wherein the second electrode of the first transistor is coupled to the first electrode of the second transistor to form a first output terminal, the first electrode of the first transistor is coupled to the second electrode of the second transistor to form a second output terminal, and the third electrodes of the first and second transistors are respectively coupled to a first power and a second power.

The resonance circuit includes a first varactor and a second varactor each having one electrode for receiving the control voltage, and an inductor coupled between other electrodes of the first and second varactors.

The voltage controlled oscillator further comprises a resistor coupled between the third electrode of the first transistor and the first power.

The first transistor includes an NMOS transistor, and the second transistor includes a PMOS transistor.

The first power supplies a voltage lower than that of the second power.

In another aspect of the present invention, a quadrature voltage controlled oscillator comprises: a first delay cell and a second delay cell further comprising a third transistor and a fourth transistor coupled in parallel to the first transistor and the second transistor of the voltage controlled oscillator disclosed in claim 1, wherein signals of the first and second output terminals of the first delay cell are applied to first electrodes of the fourth and third transistors of the second delay cell, and signals of the first and second output terminals of the second delay cell are applied to first electrodes of the third and fourth transistors of the first delay cell.

BRIEF DESCRIPTION OF THE DRAWINGS

The accompanying drawings, which are incorporated in and constitute a part of the specification, illustrate an embodiment of the invention, and, together with the description, serve to explain the principles of the invention, wherein.

DETAILED DESCRIPTION OF THE PREFERRED EMBODIMENTS

In the following detailed description, only the preferred embodiment of the invention has been shown and described, simply by way of illustration of the best mode contemplated by the inventor(s) of carrying out the invention. As will be realized, the invention is capable of modification in various obvious respects, all without departing from the invention. Accordingly, the drawings and description are to be regarded as illustrative in nature, and not restrictive. To clarify the present invention, parts which are not described in the specification are omitted, and parts for which same descriptions are provided have the same reference numerals.

A differential voltage controlled oscillator (VCO) according to an exemplary embodiment of the present invention will use two complementary elements, that is, a first complementary element M1 and a second complementary element M2, respectively including a gate, a source, and a drain. The amount and direction of currents flowing to the source from the drain and vice versa are determined depending on a voltage applied to the gate and a polarity thereof. The complementary elements include a bipolar junction transistor (BJT), a junction field-effect transistor (JFET), a metal-oxide semiconductor field-effect transistor (MOSFET), and a metal semiconductor field-effect transistor (MESFET).

It is desirable to use the MOSFETs since the MOSFETs have the least characteristic difference between complementary elements with the same specification, and hence, the MOSFETs will be described as to the complementary elements, but the scope and advantage of the present invention is not restricted to the MOSFETs.

Figure 2:
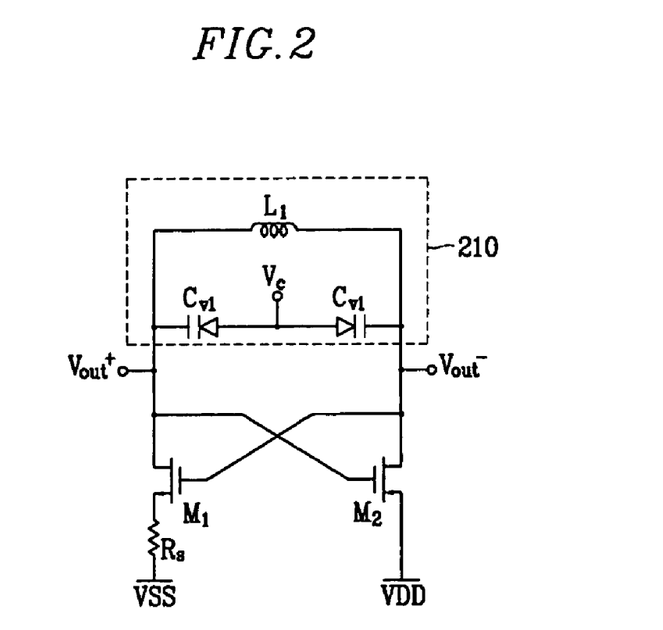
FIG. 2 shows a differential voltage controlled oscillator (VCO) according to an exemplary embodiment of the present invention.

FIG. 2 shows a differential voltage controlled oscillator (VCO) according to an exemplary embodiment of the present invention.

The voltage controlled oscillator (VCO) includes transistors M1 and M2 and a resonance circuit 210.

The transistors M1 and M2 are configured to be complementary with each other, and the transistor M1 includes an NMOS transistor and the transistor M2 includes a PMOS transistor.

A gate of the transistor M1 is coupled to a drain of the transistor M2, and a source thereof is coupled to a power VSS through a resistor Rs. In this instance, the power VSS represents a voltage source for supplying a voltage lower than a power VDD, and is assumed to supply a ground voltage. A gate of the transistor M2 is coupled to a drain of the transistor M1, and a source thereof is coupled to the power VDD.

The resonance circuit 210 includes varactors Cv1 and Cv2 and an inductor L1. One electrode of each of the varactors Cv1 and Cv2 are coupled with each other, a control voltage of Vc is applied to a node of each of the electrodes thereof, and an inductor L1 is coupled between other electrodes of the varactors Cv1 and Cv2.

An operation of the voltage controlled oscillator (VCO) according to an exemplary embodiment of the present invention will be described with reference to FIG. 3.

Figure 3:
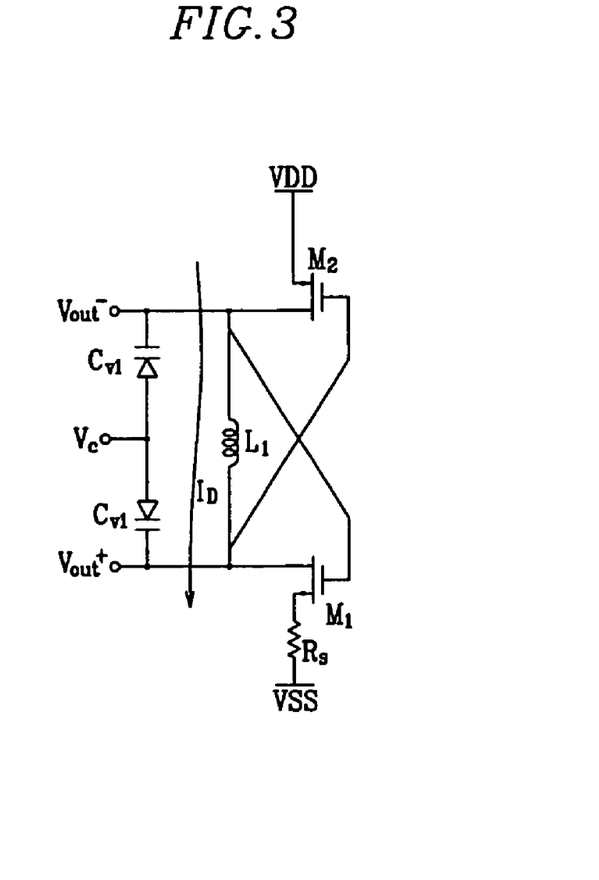
FIG. 3 shows the differential voltage controlled oscillator of FIG. 2 with respect to current.

FIG. 3 shows the differential voltage controlled oscillator of FIG. 2 with respect to current.

As shown, the transistors M1 and M2 are coupled in series, and a current ID supplied by the power VDD is applied to the transistors M1 and M2.

In detail, one transistor M2 of the transistors M1 and M2 is configured to be a PMOS transistor, and a source of the transistor M2 is coupled to the power VDD so that the transistors M1 and M2 are coupled in series with respect to the power VDD. Accordingly, the current used by the transistor M2 is used thereby again, and therefore the voltage controlled oscillator can be driven with half the current used to drive the conventional voltage controlled oscillator, and so power consumption by the voltage controlled oscillator is reduced.

The differential voltage controlled oscillator according to the exemplary embodiment uses a single inductor L1 in the resonance circuit 210. In detail, the inductor L1 is coupled in series to the power of VDD, functions as a power supply and an inductor of the resonance circuit 210, and therefore, the area of the voltage controlled oscillator on an integrated circuit is reduced.

Figure 4:
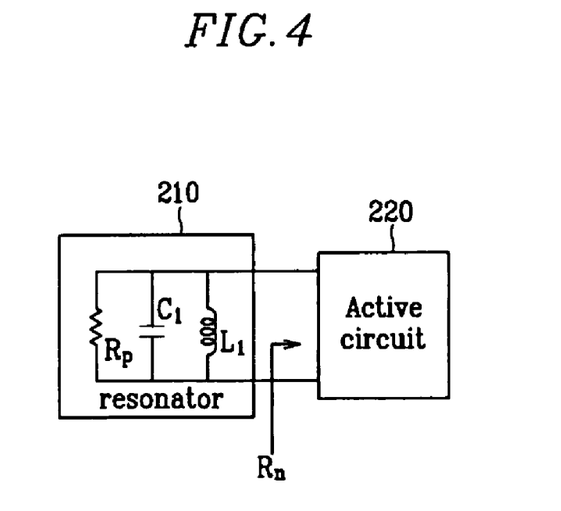
FIG. 4 shows a negative resistance model of a voltage controlled oscillator (VCO)
Figure 5:
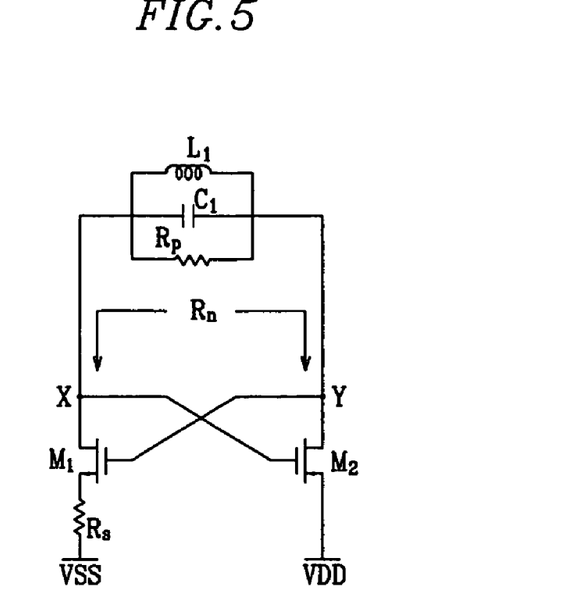
FIG. 5 shows negative resistance of a voltage controlled oscillator (VCO) according to an exemplary embodiment of the present invention.

FIG. 4 shows a negative resistance model of a differential voltage controlled oscillator (VCO), and FIG. 5 shows negative resistance of a differential voltage controlled oscillator (VCO) according to an exemplary embodiment of the present invention.

As shown in FIG. 4, the voltage controlled oscillator includes a resonance circuit 210 and an active circuit 220, where Rp is parasitic resistance of the resonance circuit 210, C1 is total capacitance of varactors Cv1 and Cv2, and Rn is a negative resistance. When the negative resistance of Rn is given to be less than the parasitic resistance of Rp, the oscillation condition is satisfied and signals are thus oscillated by a frequency determined by the resonance of a capacitor Cp and an inductor Lp.

As shown in FIG. 5, the active circuit includes switching transistors M1 and M2 and a resistor Rs, and the negative resistance of Rn is given in Equation 1 in the transconductance (gm) formats of transistors M1 and M2.

$$Rn = -\left(\frac{g_{mp} + g_{mn} + g_{mn} \cdot g_{mp} \cdot R_s}{g_{mn} \cdot g_{mp}}\right). \qquad \text{Equation 1}$$

where $g_{mn}$ is transconductance of the transistor M1, $g_{mp}$ is transconductance of the transistor M2, and $R_s$ is a source degeneration resistor, and $R_s$ reduces mismatch of differential outputs by controlling the current through the resonator.

Figure 6:
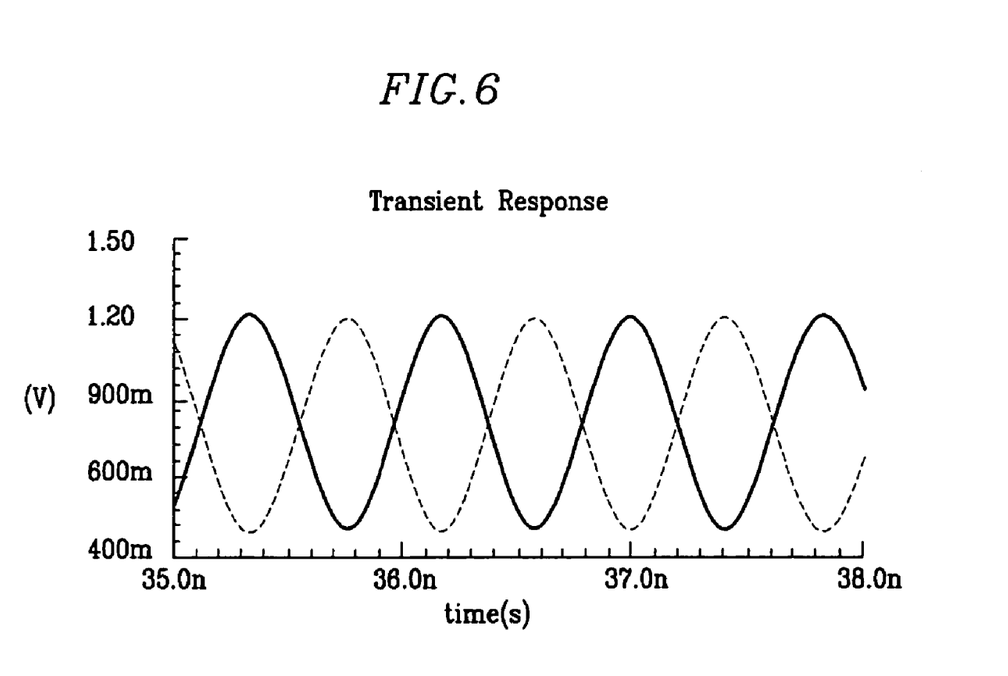
FIG. 6 shows an output waveform of a differential voltage controlled oscillator (VCO) according to an exemplary embodiment of the present invention.

FIG. 6 shows a differential output waveform of a voltage controlled oscillator (VCO) according to an exemplary embodiment of the present invention.

As shown, drains of the transistors M1 and M2 output signals substantially having the same magnitude and opposite phases.

Figure 7:
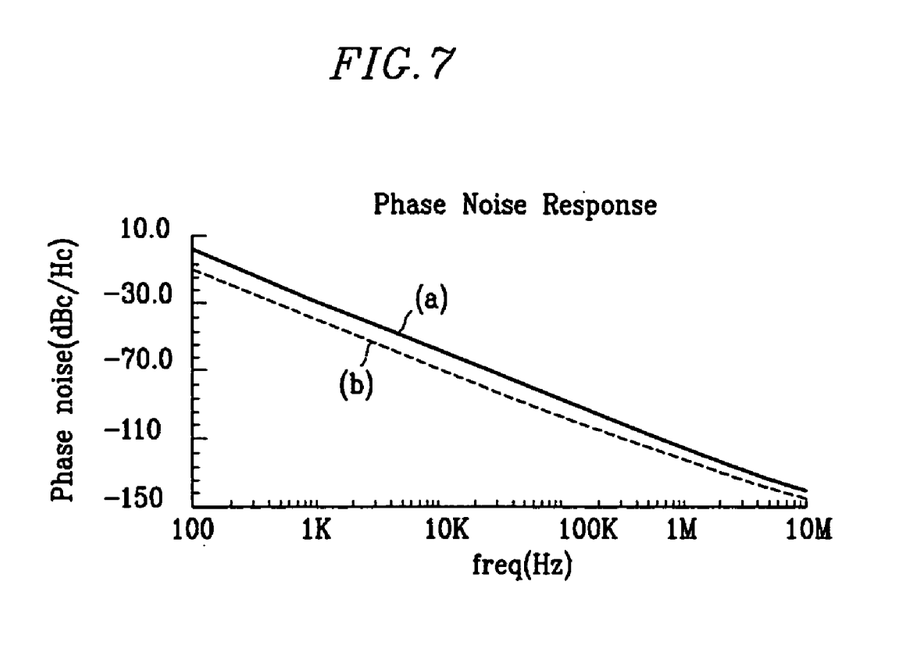
FIG. 7 shows a comparison graph of phase noise response of a conventional differential voltage controlled oscillator vs. a differential voltage controlled oscillator according to an exemplary embodiment of the present invention.

FIG. 7 shows a comparison graph of phase noise responses of a conventional differential voltage controlled oscillator vs. a differential voltage controlled oscillator according to an exemplary embodiment of the present invention where the solid line of (a) is a phase noise response of the conventional voltage controlled oscillator shown in FIG. 1 and the dotted line of (b) is a phase noise response of the voltage controlled oscillator shown in FIG. 2 according to the exemplary embodiment.

As shown, the voltage controlled oscillator according to the exemplary embodiment including an NMOS transistor M1 and a PMOS transistor M2 provides an improved phase noise response compared to the conventional voltage controlled oscillator including NMOS transistors. In addition, phase noise of the voltage controlled oscillator according to the exemplary embodiment is improved by removing the common source node which generates noise contribution of a oscillation frequency.

A quadrature voltage controlled oscillator according to an exemplary embodiment of the present invention will be described, and for ease of description, no repeated description on the configuration and operation of the above-noted voltage controlled oscillator will be provided.

Figure 8:
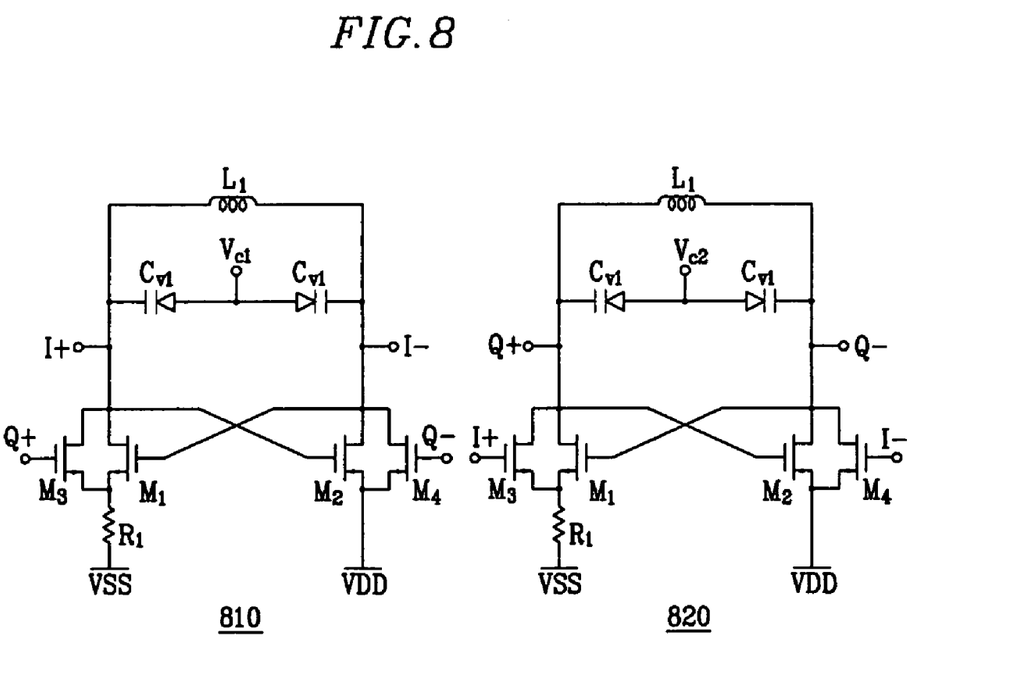
FIG. 8 shows a quadrature voltage controlled oscillator according to an exemplary embodiment of the present invention.

FIG. 8 shows a quadrature voltage controlled oscillator according to an exemplary embodiment of the present invention.

As shown, the quadrature voltage controlled oscillator includes a first delay cell 810 and a second delay cell 820, and output signals I+ and I− of the first delay cell 810 are provided to the second delay cell 820 and output signals Q+ and Q− of the second delay cell 820 are provided to the first delay cell 810.

In detail, the first and second delay cells 810 and 820 respectively include transistors M1 and M2 and coupling transistors M3 and M4 coupled in parallel to the transistors M1 and M2, and it is desirable for the coupling transistors M3 and M4 to have the same channel type as that of the transistors M1 and M2.

The output signal Q+ of the second delay cell 820 is applied to the coupling transistor M3 of the first delay cell 810, and the output signal Q− of the second delay cell 820 is applied to the coupling transistor M4 of the first delay cell 810. The output signal I− of the first delay cell 810 is applied to the coupling transistor M3 of the second delay cell 820, and the output signal I+ of the first delay cell 810 is applied to the coupling transistor M4 of the second delay cell 820.

Figure 9:
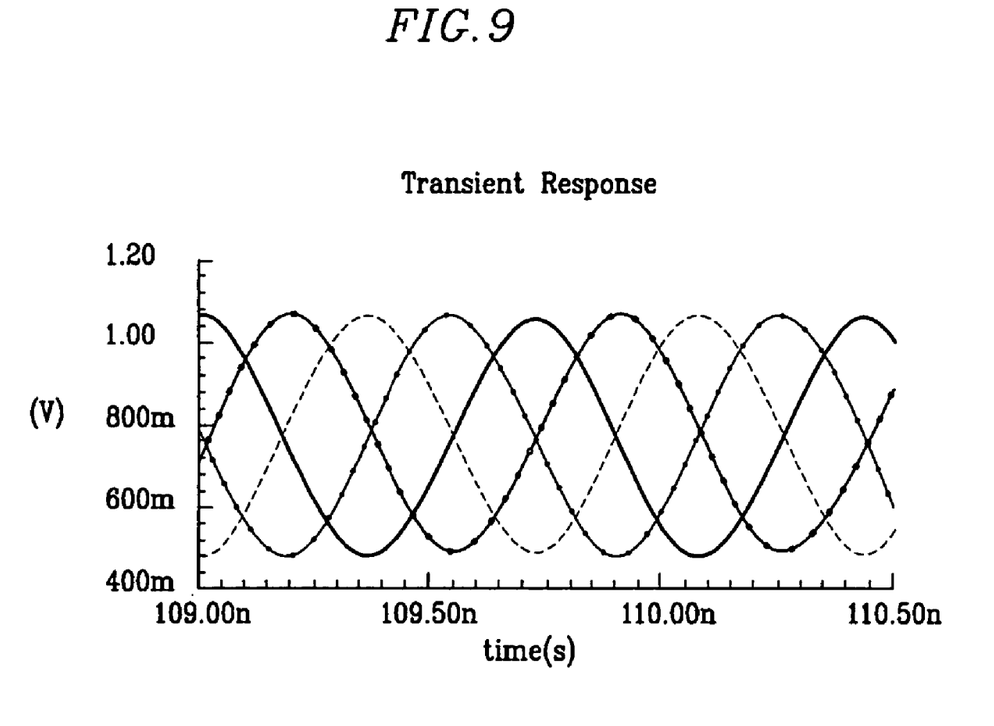
FIG. 9 shows an output waveform of the quadrature voltage controlled oscillator of FIG. 8.

As described, four output signals I+, I−, Q+, and Q− with the respective phase difference of 90° are generated by using the coupling transistors M3 and M4 to couple the delay cells 810 and 820 as shown in FIG. 9. The quadrature voltage controlled oscillator is applicable to a local oscillator for generating local oscillation signals in a transceiver shown in FIG. 10.

Figure 10:
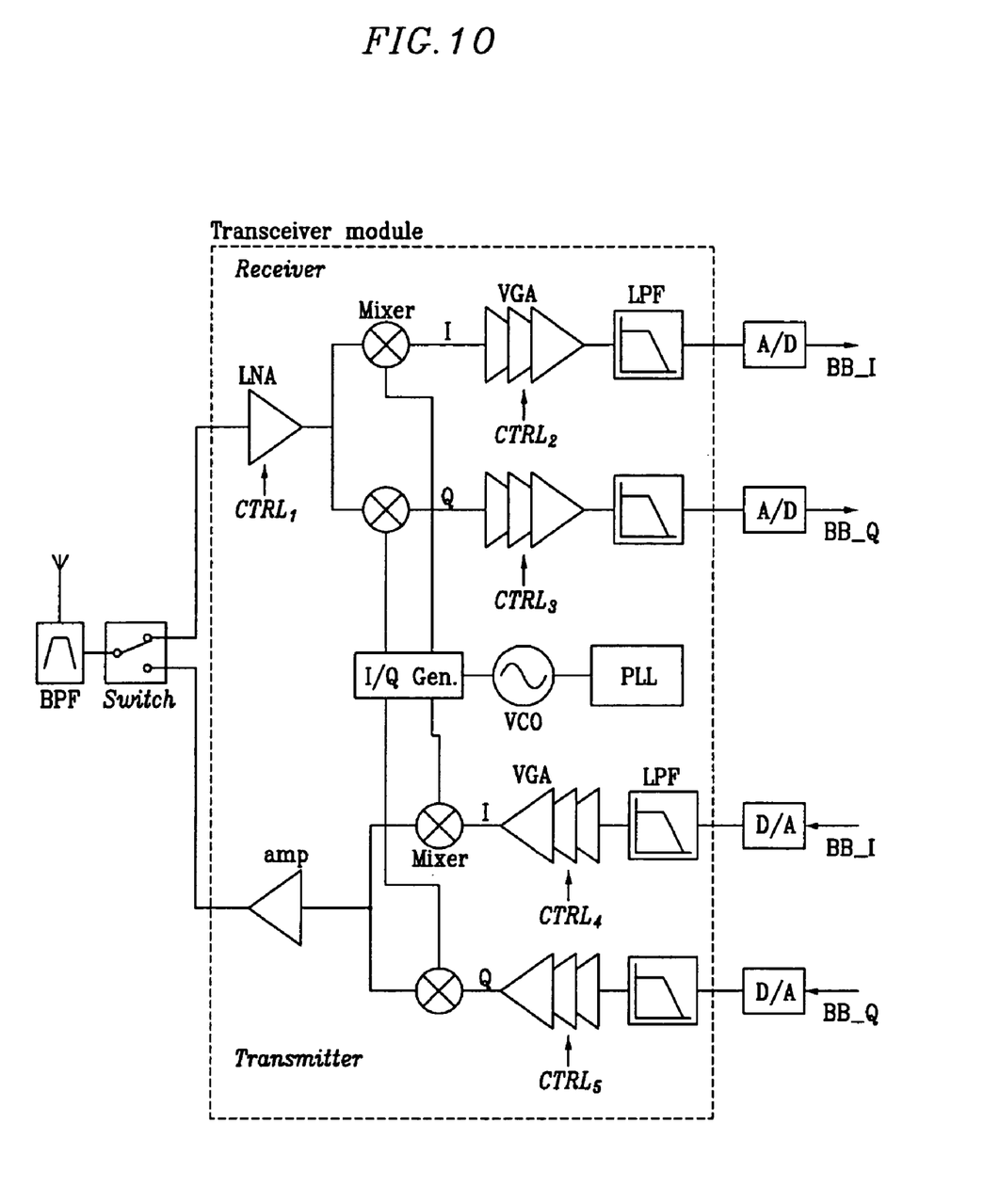
FIG. 10 shows a transceiver according to an exemplary embodiment of the present invention.

As shown in FIG. 10, as to a receiver, a signal received though an antenna is transmitted to a low-noise amplifier (LNA) through a switch, the signal amplified by the LNA is mixed with an in-phase local oscillation signal (a voltage between the output signals of I+ and I− of FIG. 8) by a mixer to generate an in-phase signal of I, and the signal amplified by the LNA is mixed with a quadrature-phase local oscillation signal (a voltage between the output signals of Q+ and Q− of FIG. 8) by a mixer to generate a quadrature-phase signal of Q.

The in-phase signal of I and the quadrature-phase signal of Q are respectively variable-gain-amplified through a variable gain amplifier (VGA), the variable-gain-amplified signals are provided to low-pass filters (LPFs) to output low-band signals. The low-band signals are converted into a baseband in-phase signal of BB_I and a baseband quadrature-phase signal of BB_Q by analog/digital (A/D) converters, and the digital signals are then reproduced to be video and/or audio signals by a reproducer.

As to a transmitter, the signals of BB_I and BB_Q are respectively converted into analog signals by a digital/analog (D/A) converter, the analog signals are then filtered by LPFs to output desired band signals, the desired signals are variable-gain-amplified by VGAs, and the amplified signals are mixed with local oscillation signals (including an in-phase local oscillation signal and a quadrature-phase local oscillation signal) by mixers. The signals output by the mixers are amplified by an amplifier, the amplified signals are transmitted to a band-pass filter (BPF) through the switch, and the filtered signals are transmitted through the antenna.

A phase-locked loop (PLL) circuit locks the frequency of the voltage controlled oscillator (local oscillator), and an I/Q signal generator uses output signals of the voltage controlled oscillator to generate the voltage between the output signals of I+ and I− to be an in-phase local oscillation signal and generate the voltage between the output signals of Q+ and Q− to be a quadrature-phase local oscillation signal.

Therefore, application of the quadrature voltage controlled oscillator to the local oscillator controls the signals of I and Q to be substantially orthogonal, improves the phase noise response of the signals of I and Q, reduces total power consumption of the transceiver, and decreases the size of an integrated circuit in which the transceiver is realized.

In the above-described embodiment, the voltage controlled oscillator is exemplarily applied to the transceiver including a local oscillator, and the same is applicable to other devices and systems. A direct conversion transceiver is used in FIG. 10, and other types of transceivers such as a super heterodyne transceiver are also applicable.

Therefore, power consumption by the differential voltage controlled oscillator according to the exemplary embodiment of the present invention is reduced by reducing the current used by the voltage controlled oscillator. The area of the integrated circuit in which the voltage controlled oscillator is realized is reduced by using a capacitor and an inductor to configure a resonance circuit of the voltage controlled oscillator. Further, the currents flowing to switching transistors correspond to each other, the mismatched state of output waveforms is prevented by establishing channel types of switching transistors to be different and applying a power supply voltage to a source of a transistor to couple the switching transistors in series with each other, and the phase noise response of the voltage controlled oscillator is improved.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

What is claimed is:

1. A differential voltage controlled oscillator comprising:
a first complementary transistor and a second complementary transistor having opposite directions of currents flowing to a third electrode from a second electrode in correspondence to a voltage applied between a first electrode and the second electrode; and
a resonance circuit being coupled to the second electrodes of the first and second transistors and controlling a frequency of an oscillation signal corresponding to a control voltage,
wherein the second electrode of the first transistor is coupled to the first electrode of the second transistor to form a first output terminal, the first electrode of the first transistor is coupled to the second electrode of the second transistor to form a second output terminal, and the third electrodes of the first and second transistors are respectively coupled to a first power and a second power, and the first transistor and the second transistor are serially connected, thereby forming a single ended structure between the first power and the second power.

2. The differential voltage controlled oscillator disclosed in claim 1, wherein the resonance circuit includes a first varactor and a second varactor each having one electrode for receiving the control voltage, and an inductor coupled between other electrodes of the first and second varactors.

3. The differential voltage controlled oscillator disclosed in claim 1, further comprising a resistor coupled between the third electrode of the first transistor and the first power.

4. The differential voltage controlled oscillator disclosed in claim 1, wherein the first transistor includes an NMOS transistor, and the second transistor includes a PMOS transistor.

5. The differential voltage controlled oscillator disclosed in claim 4, wherein the first power supplies a voltage lower than that of the second power.

6. The differential voltage controlled oscillator disclosed in claim 1, wherein the first power supplies a voltage lower than that of the second power.

7. A quadrature voltage controlled oscillator comprising:
a first delay cell and a second delay cell further comprising a third transistor and a fourth transistor coupled in parallel to the first transistor and the second transistor of the differential voltage controlled oscillator disclosed in claim 1,
wherein signals of the first and second output terminals of the first delay cell are applied to first electrodes of the fourth and third transistors of the second delay cell, and signals of the first and second output terminals of the second delay cell are applied to first electrodes of the third and fourth transistors of the first delay cell.

8. The quadrature voltage controlled oscillator disclosed in claim 7, wherein the third and fourth transistors are substantially the same type as that of the first and second transistors.

9. The quadrature voltage controlled oscillator disclosed in claim 7, wherein the resonance circuit includes a first varactor and a second varactor each having one electrode for receiving a control voltage, and an inductor coupled between other electrodes of the first and second varactors.

10. A transceiver comprising:
a differential voltage controlled oscillator comprising:
a first complementary transistor and a second complementary transistor having opposite directions of currents flowing to a third electrode from a second electrode in correspondence to a voltage applied between a first electrode and the second electrode; and
a resonance circuit being coupled to the second electrodes of the first and second transistors and controlling a frequency of an oscillation signal corresponding to a control voltage,
wherein the second electrode of the first transistor is coupled to the first electrode of the second transistor to form a first output terminal, the first electrode of the first transistor is coupled to the second electrode of the second transistor to form a second output terminal, and the third electrodes of the first and second transistors are respectively coupled to a first power and a second power, and the first transistor and the second transistor are serially connected, thereby forming a single ended structure between the first power and the second power; and
the quadrature voltage controlled oscillator of claim 7.

* * * * *